(12) United States Patent  (10) Patent No.: US 8,716,688 B2
Strachan et al.  (45) Date of Patent: May 6, 2014

(54) ELECTRONIC DEVICE INCORPORATING MEMRISTOR MADE FROM METALLIC NANOWIRE

(75) Inventors: Douglas R. Strachan, Lexington, KY (US); Stephen L. Johnson, Lexington, KY (US)

(73) Assignee: The University of Kentucky Research Foundation, Lexington, KY (US)

( * ) Notice: Subject to any disclaimer, the term of this patent is extended or adjusted under 35 U.S.C. 154(b) by 177 days.

(21) Appl. No.: 13/035,582

(22) Filed: Feb. 25, 2011

(65) Prior Publication Data

US 2011/0204310 A1  Aug. 25, 2011

(51) Int. Cl.
*H01L 45/00*  (2006.01)
(52) U.S. Cl.
USPC .................................................. 257/2; 257/5
(58) Field of Classification Search
USPC ....................................................... 257/2, 5
See application file for complete search history.

(56) References Cited

U.S. PATENT DOCUMENTS

| | | | |
|---|---|---|---|
| 3,679,947 A | 7/1972 | Chakraverty et al. | |
| 5,714,400 A | 2/1998 | Hirao et al. | |
| 6,583,533 B2 * | 6/2003 | Pelrine et al. | 310/309 |
| 6,617,649 B2 | 9/2003 | Chang et al. | |
| 6,636,433 B2 | 10/2003 | Tanikawa | |
| 7,014,795 B2 * | 3/2006 | Grigorov et al. | 252/500 |
| 7,145,824 B2 | 12/2006 | Bill et al. | |
| 7,181,836 B2 | 2/2007 | Tsakalakos | |
| 7,257,016 B2 | 8/2007 | Snider | |
| 7,394,687 B2 | 7/2008 | Bertin et al. | |
| 7,443,721 B2 | 10/2008 | Kurotsuchi et al. | |
| 7,479,654 B2 * | 1/2009 | Bertin et al. | 257/40 |
| 7,492,624 B2 | 2/2009 | Mascolo et al. | |
| 7,583,526 B2 | 9/2009 | Bertin et al. | |
| 7,733,685 B2 | 6/2010 | Scheuerlein et al. | |
| 7,778,061 B2 | 8/2010 | Robinett et al. | |
| 7,782,650 B2 | 8/2010 | Bertin et al. | |
| 7,838,809 B2 * | 11/2010 | Ludwig | 250/214 A |
| 7,859,036 B2 | 12/2010 | Liu et al. | |
| 8,274,130 B2 * | 9/2012 | Mihnea et al. | 257/497 |
| 2008/0159042 A1 | 7/2008 | Bertin et al. | |
| 2009/0242405 A1 * | 10/2009 | Mayer et al. | 204/435 |
| 2009/0250689 A1 | 10/2009 | Colli | |
| 2010/0109656 A1 | 5/2010 | Wang et al. | |
| 2010/0276667 A1 | 11/2010 | Kim et al. | |
| 2010/0277232 A1 | 11/2010 | Snider | |
| 2011/0005808 A1 | 1/2011 | White et al. | |
| 2011/0017977 A1 | 1/2011 | Bratkovski et al. | |
| 2011/0024716 A1 | 2/2011 | Bratkovski et al. | |
| 2011/0174079 A1 * | 7/2011 | Manohara et al. | 73/753 |
| 2011/0204316 A1 * | 8/2011 | Kreupl et al. | 257/5 |

FOREIGN PATENT DOCUMENTS

| | | |
|---|---|---|
| JP | 2006148063 A | 6/2006 |
| JP | 2010114422 A | 5/2010 |

* cited by examiner

*Primary Examiner* — Eugene Lee
(74) *Attorney, Agent, or Firm* — King & Schickli, PLLC

(57) ABSTRACT

An electronic device includes a first electrode, a second electrode and a nanowire connected between the first and second electrodes to allow electric current flow. The nanowire is made from a conductive material exhibiting a variable resistance due to electromigration. The nanowire is repeatably switchable between two states. A voltage clamp operates through feedback control to maintain the voltage across the nanowire and prevent thermal runaway.

20 Claims, 20 Drawing Sheets

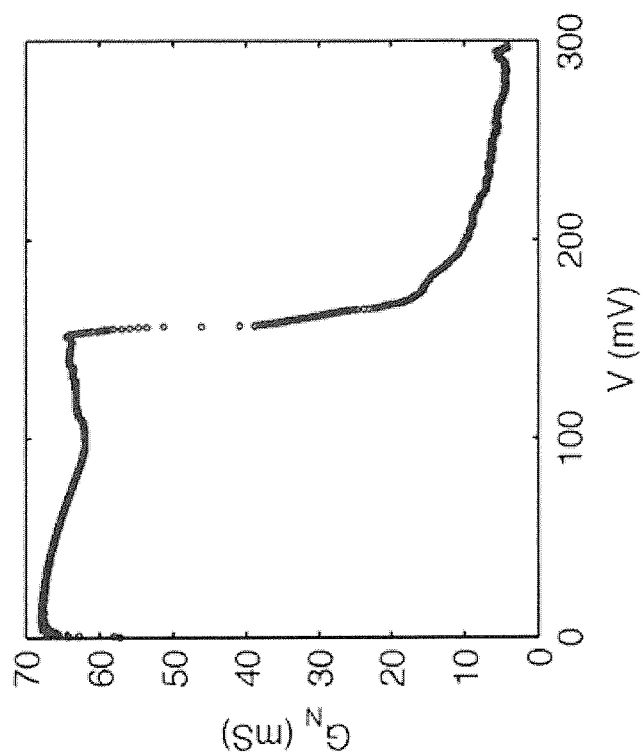
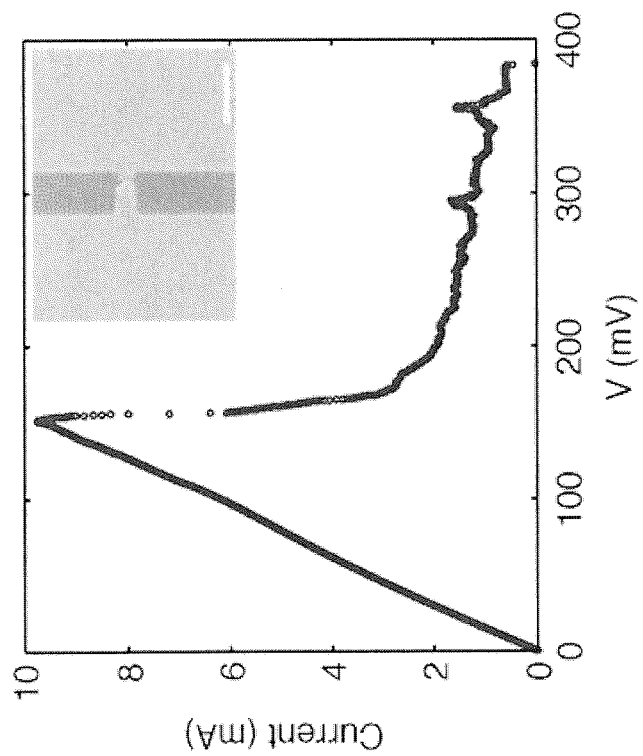
Fig. 14c
Fig. 14d

ELECTRONIC DEVICE INCORPORATING MEMRISTOR MADE FROM METALLIC NANOWIRE

This invention was made with government support under grant No. DMR-0805136 awarded by the National Science Foundation. The government has certain rights in the invention.

This application claims priority to U.S. Provisional Patent Application Ser. No. 61/338,931 filed 25 Feb. 2010, the entire disclosure of which is incorporated herein by reference.

TECHNICAL FIELD AND INDUSTRIAL APPLICABILITY OF THE INVENTION

This document relates to the field of electronic devices and, more particularly, to electronic devices incorporating one or more memristors.

BACKGROUND OF THE INVENTION

Metals have long been used to form resistors, capacitors, and inductors—the three classical passive circuit elements in which geometry determines the principle behavior of the device. A fourth passive circuit element, the memristor, has generated significant recent interest due to its potential use in nanoscale logic and memory devices. Among the presently demonstrated memristors are those whose resistance depends on state variables such as coupled ionic and electronic conduction, phase transistions, redox reactions in organic semiconductors, and the configuration of molecular heterostructures.

U.S. Pat. No. 6,636,433 discloses an electronic device incorporating a memory core comprising either a material that can be electromigrated or a carbon nanotube having a hollow core holding a material that can be electromigrated which alters the overall conduction based on its position. To electromigrate the material, the approach disclosed in U.S. Pat. No. 6,636,433 is to utilize the Joule heating within the material or nanotube itself in order to increase the rate of electromigration, which depends sensitively on the mobility of the atoms. However, achieving an applied Joule heating that can be used to help controllably electromigrate atoms without causing catastrophic runaway is non-trivial.

Memristor devices are presented in this document containing a feedback configuration. The memristors consist of conductors which are stable in at least two states which can be accessed through the application of an applied voltage and current. The applied voltage and current induce migration of material within the memristor which changes its state. This effect can be used to store non-volatile memory. The feedback included in this configuration permits a specific voltage to be applied directly across a nanowire which allows it to be reproducibly switched between states and prevents thermal runaway breakdown of the memristive device. This configuration can be implemented with a single component nanowire and electrode geometry.

Advantageously, the feedback system of the current document permits precise and controllable Joule heating to the nanowire memristive element without thermal destruction of the device. The current feedback system also permits consistent voltage application to all nanowire memristive elements in applications where a plurality is utilized. This consistent voltage application, regardless of physical changes occurring in the memristive elements, could result in significant improvements to device performances, reproducibility among nominally identical memristive elements, and lifetime.

SUMMARY OF THE INVENTION

This document describes an electronic device comprising a first electrode, a second electrode and a nanowire connected between the first and second electrodes to allow electric current flow. The nanowire is made from a conductive material exhibiting variable resistance $R_N$ due to electromigration. The nanowire is repeatedly switchable between a first state having a first physical geometry producing a first resistance $R_1$ and a second state having a second physical geometry producing a second resistance $R_2$ where $R_1 > R_2$. In addition, the device includes a voltage clamp, operating through feedback control, connected to the nanowire. The voltage clamp produces a bias voltage $V_{tot}$ that maintains the applied voltage V across the nanowire regardless of the resistance $R_N$ and prevents thermal run away and nonreversible device failure.

The voltage clamp may comprise a circuit including a combination of an operational amplifier, an instrumentation amplifier, a follower and transistors connected to the first electrode by a first lead and to the second electrode by a second lead. In an alternative embodiment the voltage clamp comprises an integrated voltage control device that may include, for example, at least one transistor.

The electronic device includes a sense electrode for sensing electric resistance of the nanowire. In an alternative embodiment a first sense electrode may be connected to the first electrode and a second sense electrode may be connected to the second electrode. Further, in one useful embodiment the nanowire, the first electrode and the second electrode are all made from a single component material.

In accordance with an additional aspect, an integrated electronic device comprises a plurality of memristors arranged on a single substrate. Each of the plurality of memristors includes a first electrode, a second electrode and a nanowire connected between the first electrode and the second electrode to allow electric current flow. The nanowire is made from a conductive material exhibiting variable resistance $R_N$ due to electromigration. The nanowire is repeatedly switchable between a first state having a first physical geometry producing a first resistance $R_1$ and a second state having a second physical geometry producing a second resistance $R_2$ where $R_1 > R_2$. In addition, the integrated electronic device includes a voltage clamp, operating through feedback control, connected to the nanowires of the plurality of memristors. The voltage clamp produces a bias voltage $V_{tot}$ that maintains the applied voltage V across the nanowires regardless of resistance $R_N$ and presents thermal runaway.

In the following description there is shown and described several different embodiments of electronic devices, simply by way of illustration of some of the modes best suited to carry out the invention. As it will be realized, the invention is capable of other different embodiments and its several details are capable of modification in various, obvious aspects all without departing from the invention. Accordingly, the drawings and descriptions will be regarded as illustrative in nature and not as restrictive.

BRIEF DESCRIPTION OF THE DRAWINGS

The accompanying drawings incorporated herein form a part of the specification, and illustrate several aspects of the devices described in this document. In the drawings:

FIG. 14c graphically illustrates the current through the nanowire as a function of applied voltage (as applied voltage is ~150 mV the nanowire conductance drops significantly due to electromigration: the inset showing the resulting nanowire with an electromigrated break (scale bar 400 nm));

FIG. 14d is a graphical representation of nanowire conductance as a function of the applied voltage;

FIG. 16b graphically illustrates the conductance and nanowire voltage data corresponding to the I-V curves in FIG. 16a.

Reference will now be made in detail to the present preferred embodiments of the electronic devices, examples of which are illustrated in the accompanying drawings.

DETAILED DESCRIPTION OF THE PREFERRED EMBODIMENTS OF THE INVENTION

Figure 1:
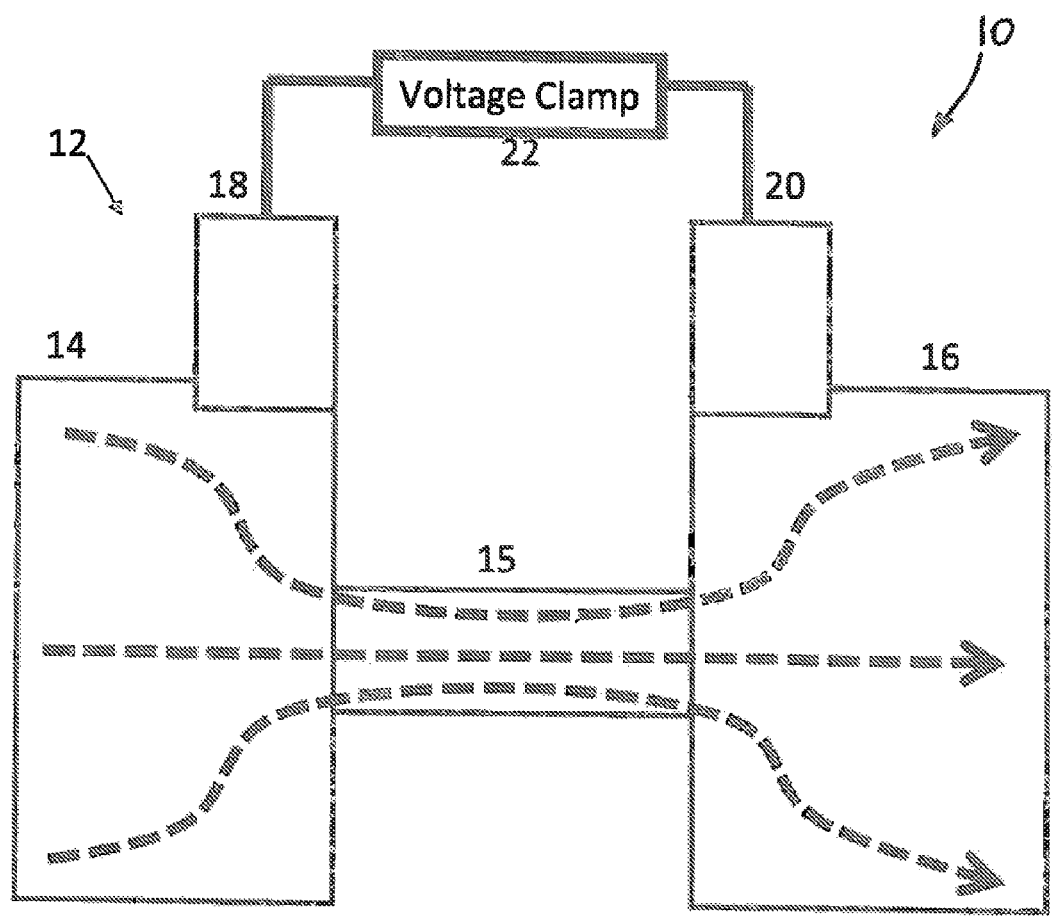
FIG. 1 is a schematical block diagram of an electronic device.

An electronic device 10 may be generally described as including a memristor 12 and a voltage clamp 22 that operates through feedback control to prevent thermal runaway and nonreversible device failure. The memristor structure 12 contains a resistor that changes its resistance state upon the application of a current. There are several possible implementations of the technology. FIG. 1 shows a schematic of the device structure. The memristor 12 contains a uniform conducting material formed in the shape of a nanowire 15 with four electrical connections or electrodes 14, 16, 18, 20. The first two electrodes 14, 16 allow for current to be applied through the bridge. The other two electrodes 18, 20 are the voltage control (voltage clamp) leads that precisely specify the voltage regardless of how the nanowire conducting properties might change.

Figure 2:
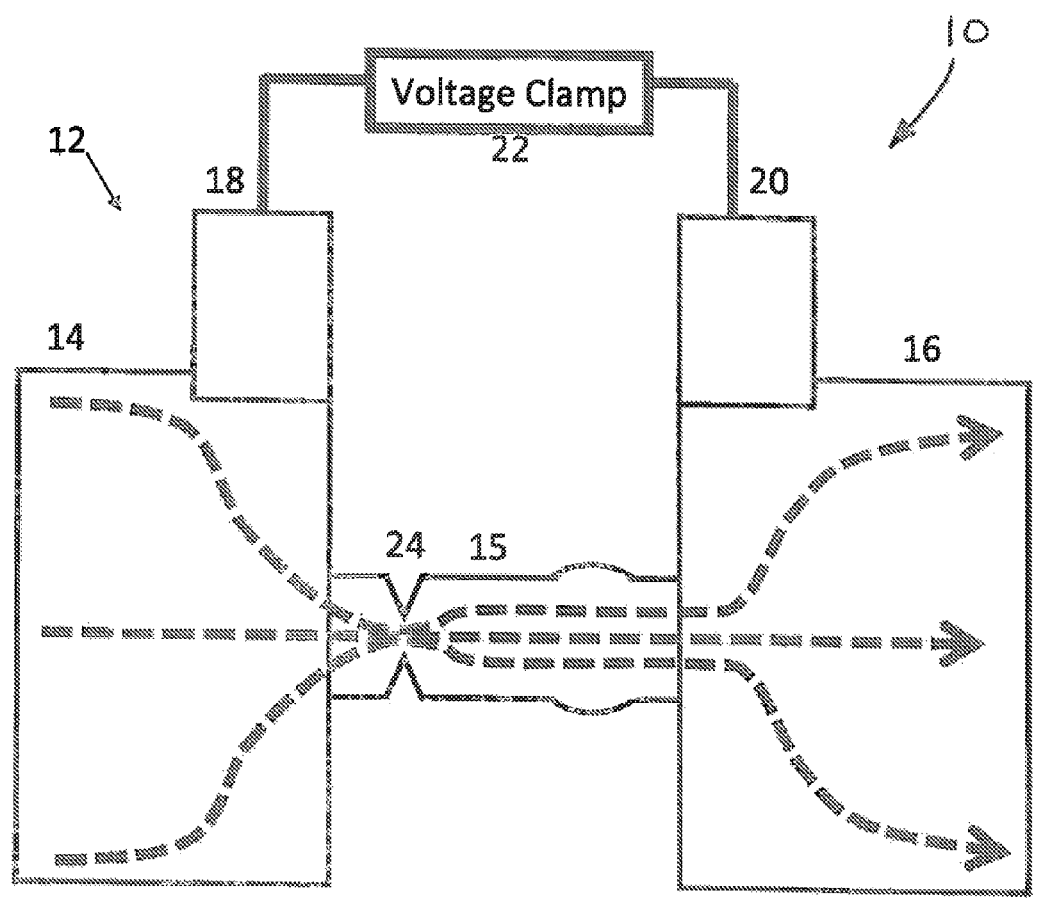
FIG. 2 is a schematical block diagram similar to FIG. 1 illustrating nanowire electromigration.

The purpose of the voltage clamp 22 is demonstrated in FIG. 2. FIG. 2 represents a nanowire 15 which has been physically altered through electromigration so that the electrical resistance is high in one specific region (the narrow region) 24. This change in structure occurs because electrical current flowing through the nanowire 15 imparts momentum to the metal atoms and essentially pushes them to the right, where they pile up. The overall resistance of the nanowire 15 will increase since the increase in resistance due to the void is greater than the decrease in resistance due to the mound of metal on the right. In the region 24 of the constriction, the current represented by the dashed lines (and flowing in the sense of the arrows) becomes bunched. This results in significant self (Joule) heating of the wire. As a result of an increased temperature, the metal atoms become increasingly mobile and more easily pushed by the applied electric current. With no voltage clamp present, an applied current will quickly cause the system to catastrophically runaway and the void will grow to a complete break of the nanowire 15 and the device is no longer operable. By using the voltage clamp 22, which is connected to the current source through the feedback loop (described in detail below) the current is forced to be reduced to a tolerable level when the void formation begins.

Figure 3:
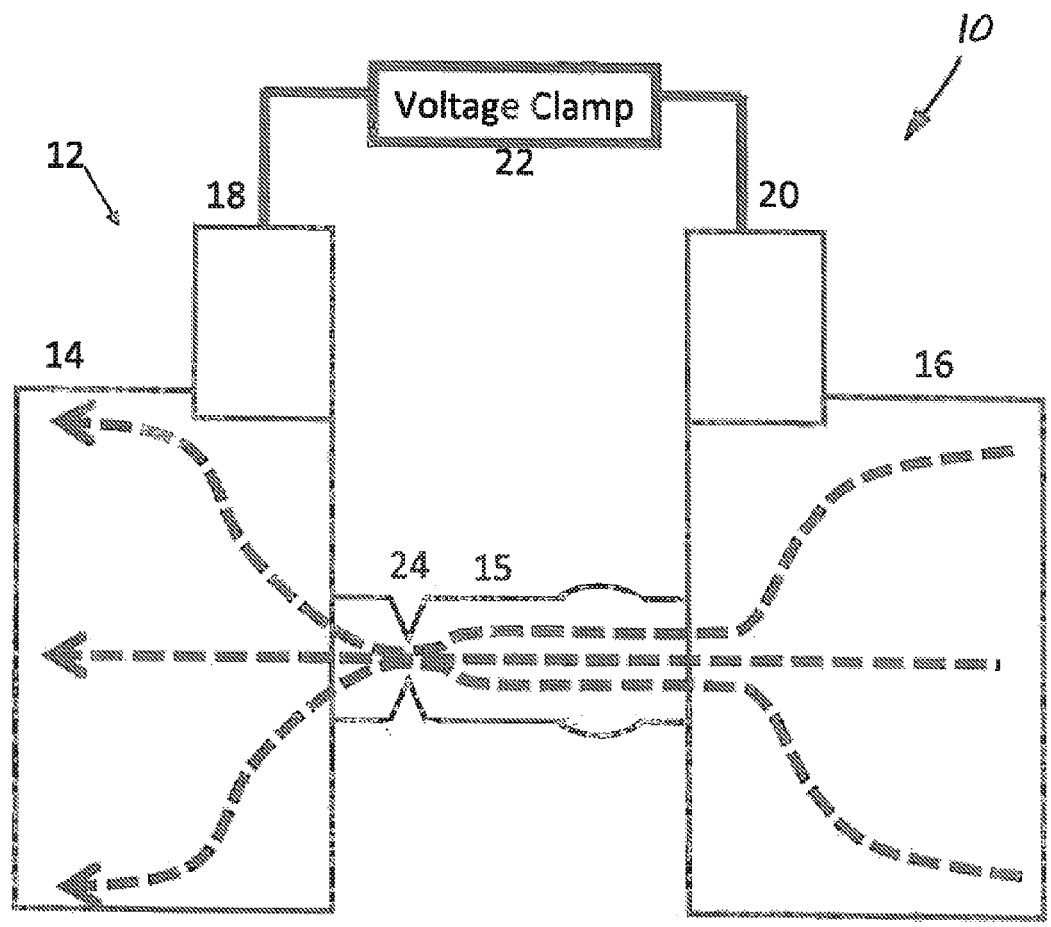
FIG. 3 is a schematical block diagram similar to FIGS. 1 and 2 illustrating current flowing in a reverse direction.

To form a memristive switch through this feedback configuration, the voltage clamp voltage can be reversed biased to push a current in the opposite sense (FIG. 3). This results in the mound of conducting material on the right being pushed back into the void on the left (FIG. 4), and the resulting nanowire resistance decreasing.

A sensing electrode to read the resistance state of the nanowire can be implemented in several ways. The first is by utilizing all the existing electrodes and feedback circuitry (FIGS. 1 and 2). By applying a small voltage clamp to the device the current can be measured flowing through it. As long as it is small enough not to push the material of the nanowire, it will only sense its state.

Figure 5:
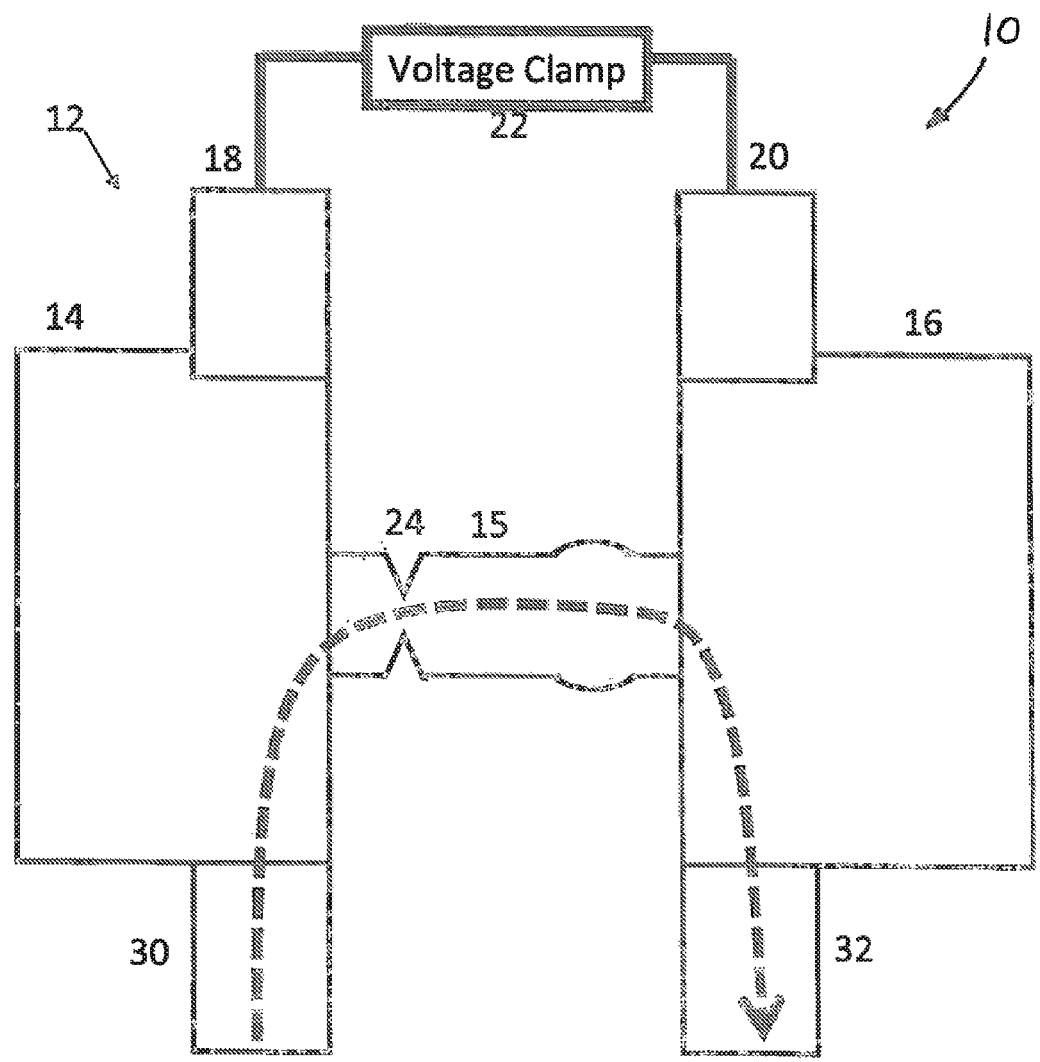
FIG. 5 is a schematical block diagram illustrating the structure of FIG. 1 with the addition of two sense electrodes.

An alternative configuration utilizes additional sense leads 30, 32 on the side (FIG. 5) which allow a small sense current to be applied to the nanowire 15 only through these leads. When the sensing is performed, electrodes 14, 16 are isolated from the feedback system, so that the current is forced to flow through the nanowire 15.

Figure 6:
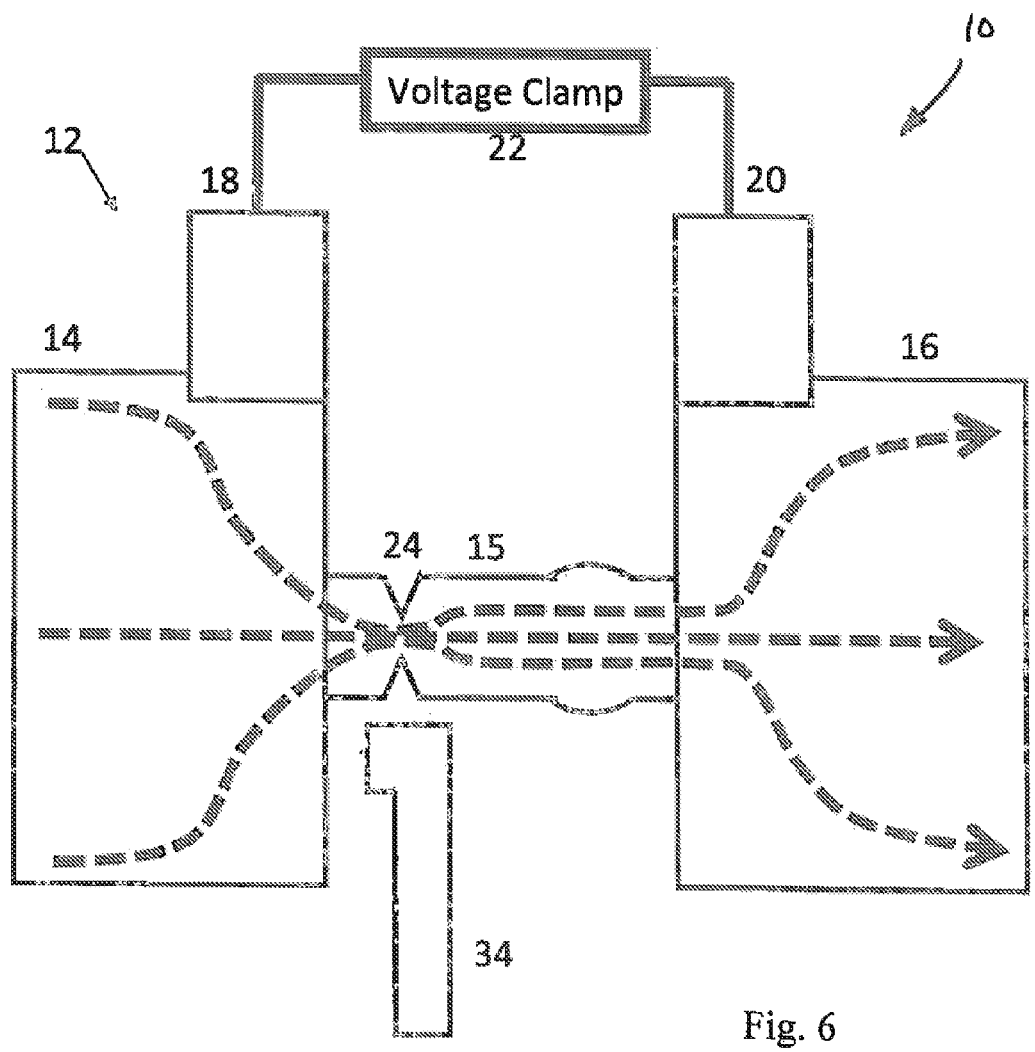
FIG. 6 is an illustration similar to FIG. 5 but showing an alternative embodiment with a single sense electrode.

A third sensing method comprises capacitive coupling to a sense electrode 34 (FIG. 6). As the geometry of the nanowire 15 changes, the capacitive coupling to a nearby wire will change. This capacitance change can be used as the indicator of the state of the nanowire 15. The capacitance measurement can be achieved by measuring an AC current flowing between the sense electrode 34 and any of the other electrodes 14, 16 in the system. If the amplitude of the applied AC sense voltage is kept low and its frequency high, then the sensing will not alter the memristive state of the nanowire 15. If the frequency is kept high enough, the sense electrode 34 could simultaneously measure the state of the memristor 12 without the need for write steps that isolate the other electrodes (see more on this in discussion below).

To implement the capacitive sensing method, requires significant capacitive coupling between a nanowire 15 and a sense electrode 34. This can be achieved through the use of an underlying metal containing a thin oxide layer (such as Al/Al$_2$O$_3$). The sense electrode 34 made from such a metal will be deposited on the substrate first, then the nanowire 15 constructed on top of it. When the nanowire 15 is migrated from on top of it over a portion, there can be a significant change in capacitance if the oxide is thin enough.

The above scheme for feedback memristive memory can be implemented with a number of material and geometrical configurations.

Single Compound Materials

Feedback controlled memristors 12 can be constructed from a variety of uniform materials. In these cases the memristive state is determined by the physical shape of the nanowire 15 as discussed above in FIG. 2. These single component materials include single and compound element materials that do not phase separate as the electrical current changes the physical shape of the nanowire 15. Examples include, but are not limited to CU, AU, AG, Pt, Al, NI, and alloys comprising these metals.

Phase Separable Materials

Figure 7:
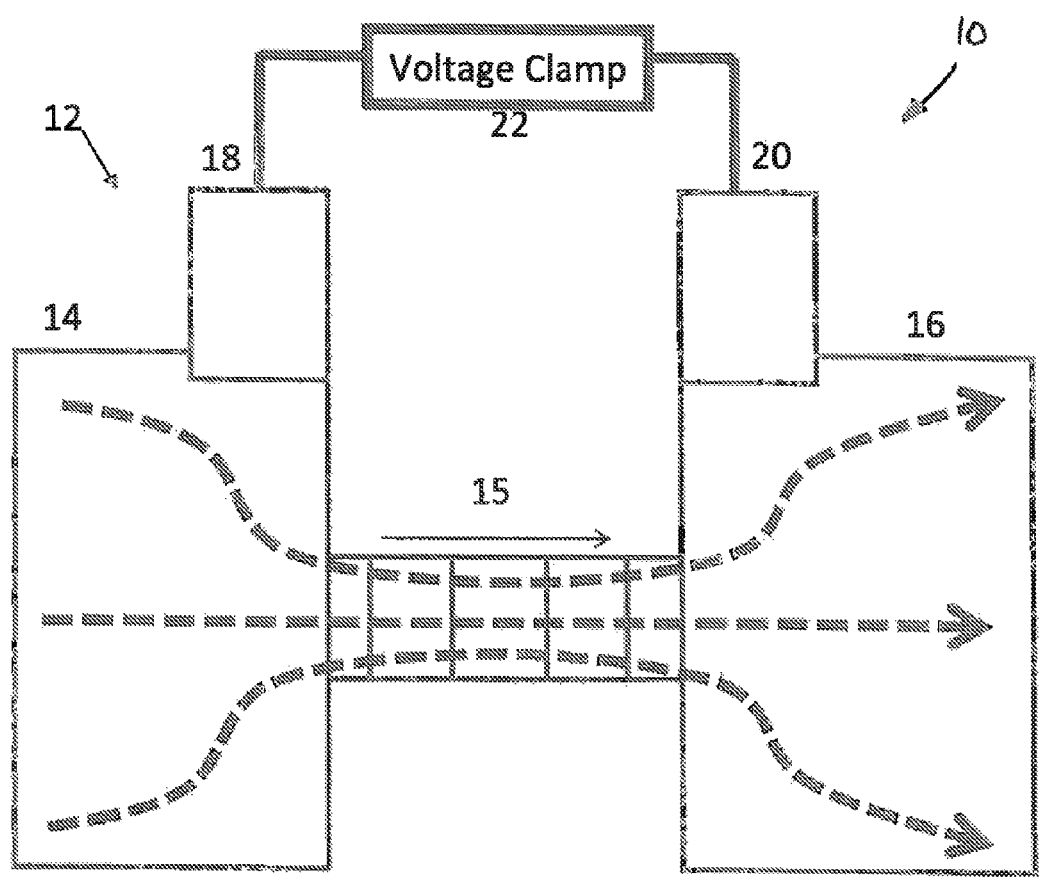
FIG. 7 is a schematical block diagram similar to FIG. 1 but showing a nanowire made from phase separable materials.

Alternatively, phase, separable materials that contain atoms which migrate at significantly different rates upon application of a current can also be implemented into the invented feedback scheme. In these phase separable materials one group of atoms (Material A) migrate while the other (Material B) remains fixed (FIG. 7). This causes two new regions to emerge, one with lower concentration of A and the other with higher concentration. These two other regions can have drastically different electrical resistance than the parent compound, thus causing the nanowire resistance to dramatically change. Reversing the voltage clamp 22 which causes the current flow to reverse will cause the materials to mix back together into the parent compound. Examples include, but are not limited to SrTiO$_3$, TiO$_2$ and (Nd$_{2/3-x}$Li$_{3x}$)TiO$_3$.

Compound materials can also represent heterogeneous combinations and mixtures of nanomaterials, such as metallic particles on graphene or carbon nanotube surfaces.

Nanowire Materials

Figure 8:
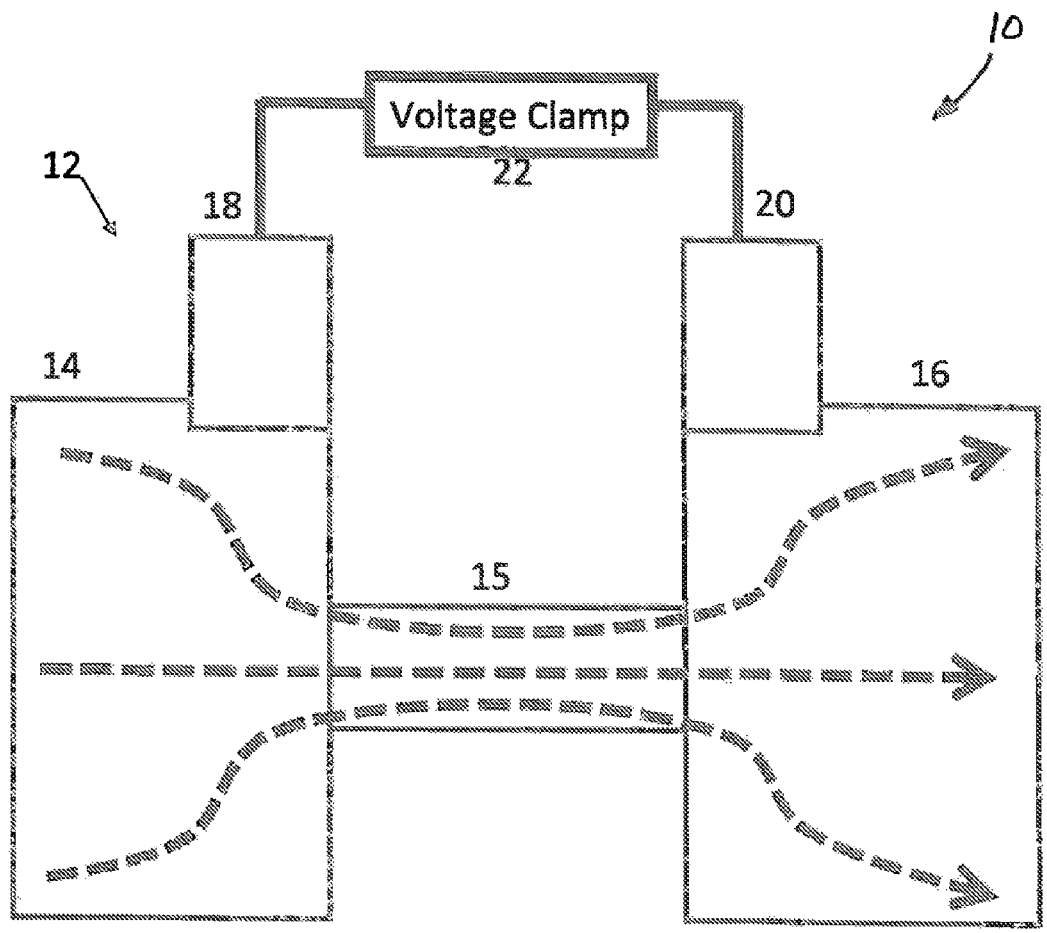
FIGS. 8 and 9 are schematical block diagrams illustrating electronic devices with a nanowire constructed from a different material than the associated electrodes.
Figure 9:
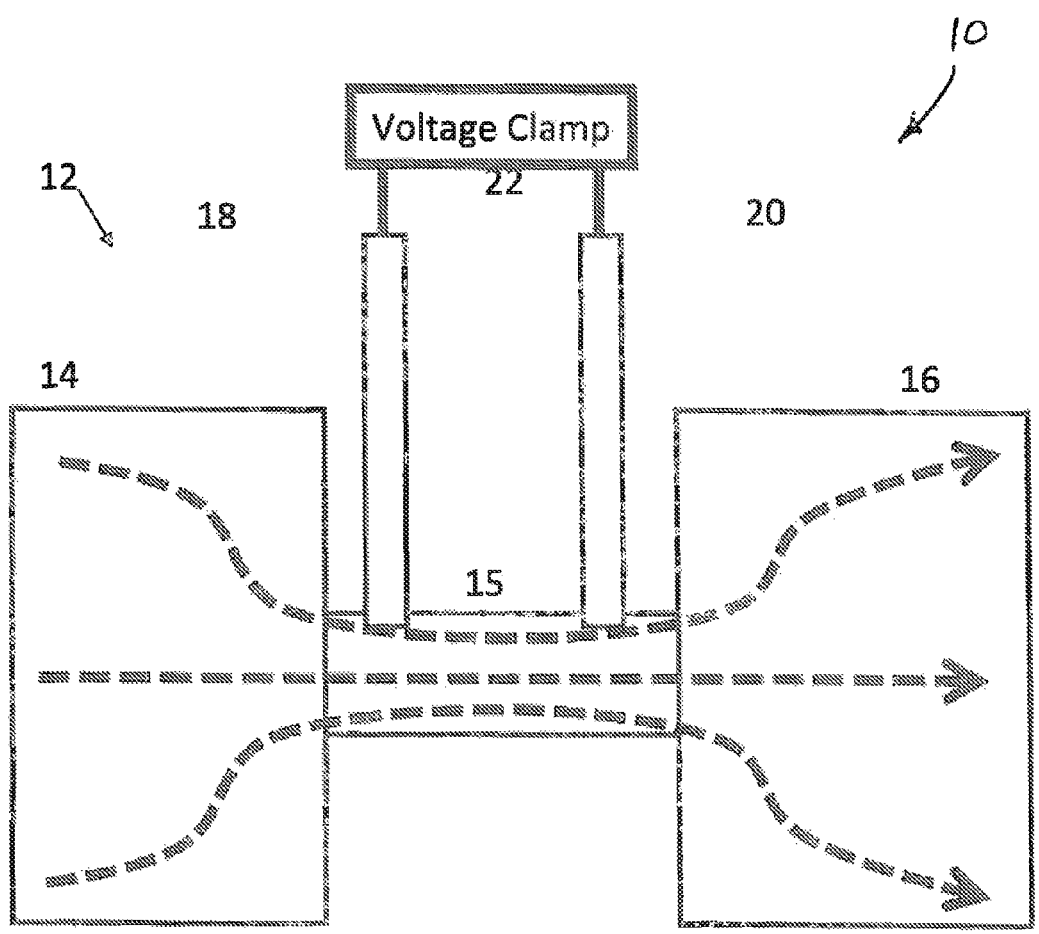

The feedback memristor scheme is also applicable to systems comprising a nanowire 15 constructed from a different material to that of the other electrodes 14, 16, 18, 20 (FIGS. 8 and 9). In this implementation, the voltage clamp electrodes 18, 20 can be attached to the sides of the larger current electrodes 14, 16 or to the side of the nanowire 15 itself. Either of the two materials represented in FIGS. 8 and 9 could represent either uniform single element materials or compound materials as described above.

Feedback Scheme and Implementation

Figure 10:
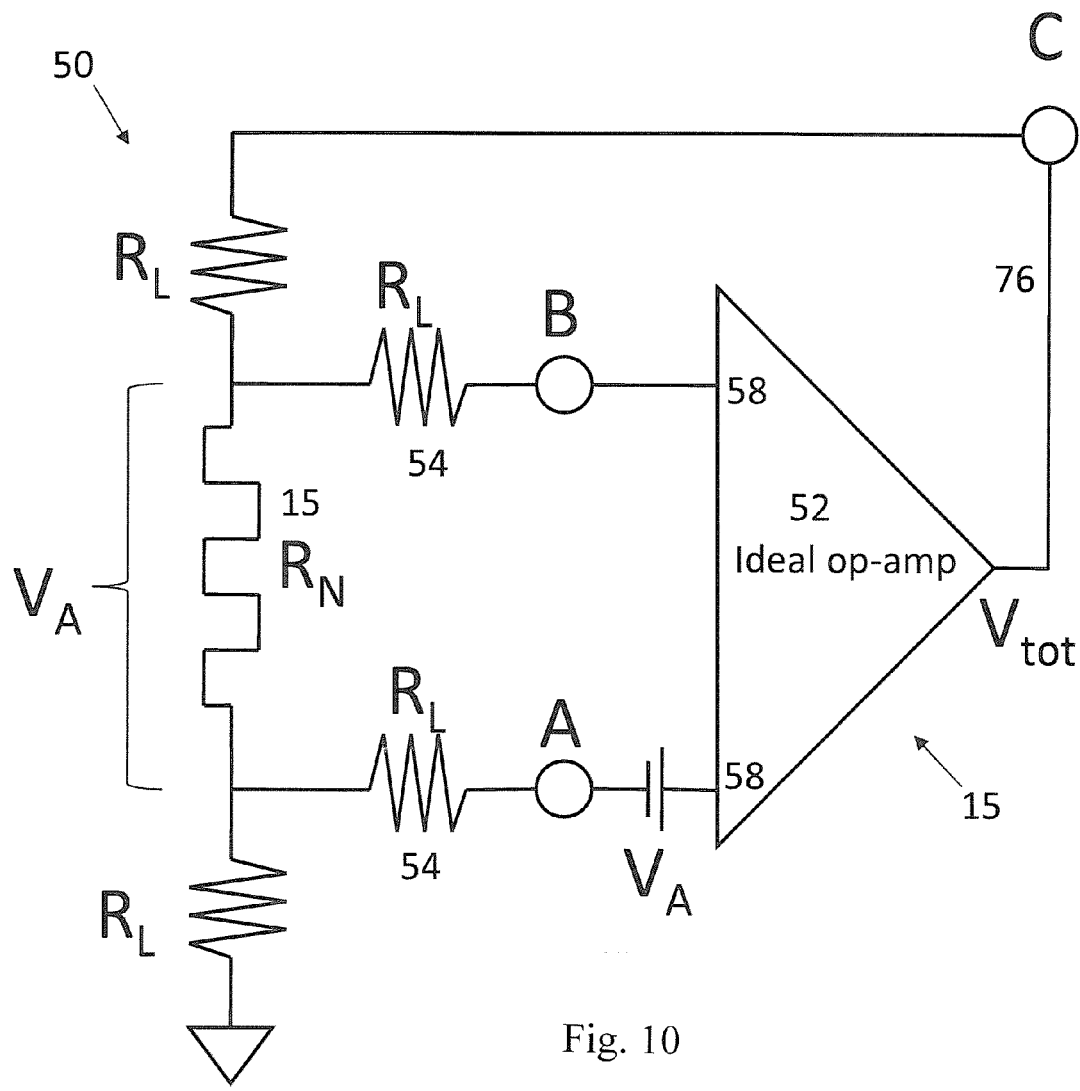
FIG. 10 is an electrical schematic of a general feedback scheme.

FIG. 10 shows a schematic of the general feedback scheme. This circuit 50 applies a voltage clamp 22 to a nanowire 15. The operational amplifier (op-amp) portion 52 of the circuit 50 maintains the applied voltage (V) across the nanowire 15, which has a variable resistance ($R_N$), by sourcing current from its output with a variable voltage ($V_{tot}$). Since negligible voltage is dropped across the lead resistances 54 tied into the op-amp inputs 58, V appears across the metallic nanowire 15 regardless of its resistance, $R_N$. When the nanowire resistance changes due to electromigration (as represented in FIG. 2), the op-amp 52 swings its total current and voltage output ($V_{wt}$) so that the voltage drop across the metallic nanowire 15 is clamped at V. This voltage-clamp circuit 50 prevents thermal runaway as discussed above.

Schemes for Constructing the Voltage Clamp Circuitry

Figure 11:
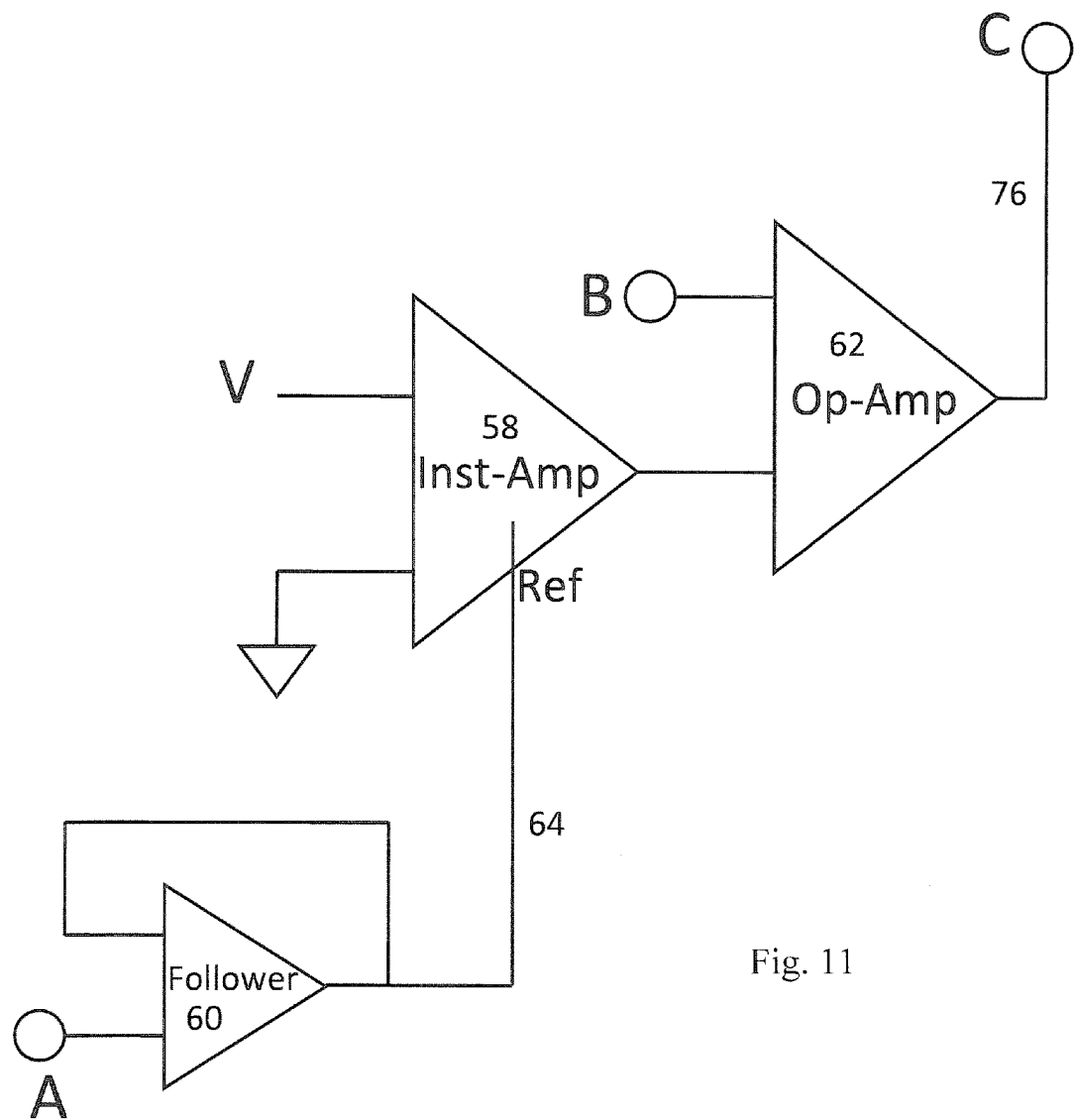
FIG. 11 is an electrical schematic of a voltage clamp circuit.

To achieve the effective circuitry in FIG. 10 with standard on-chip voltage sourcing, several schemes can be utilized. The voltage source ($V_A$) and op-amp 52 part of the circuit 50 can be constructed from a standard instrumentation amplifier (a differential amplifier) 58, a follower 60, and an operational amplifier 62. These can all be located on a chip 100 containing arrays of memristive nanowire elements 15. FIG. 11 shows a schematic of such an arrangement. The instrumentation amplifier 58 allows for Reference lead voltage to be determined by point A of FIG. 10, while the follower 60 blocks any current through this lead 64.

Figure 12:
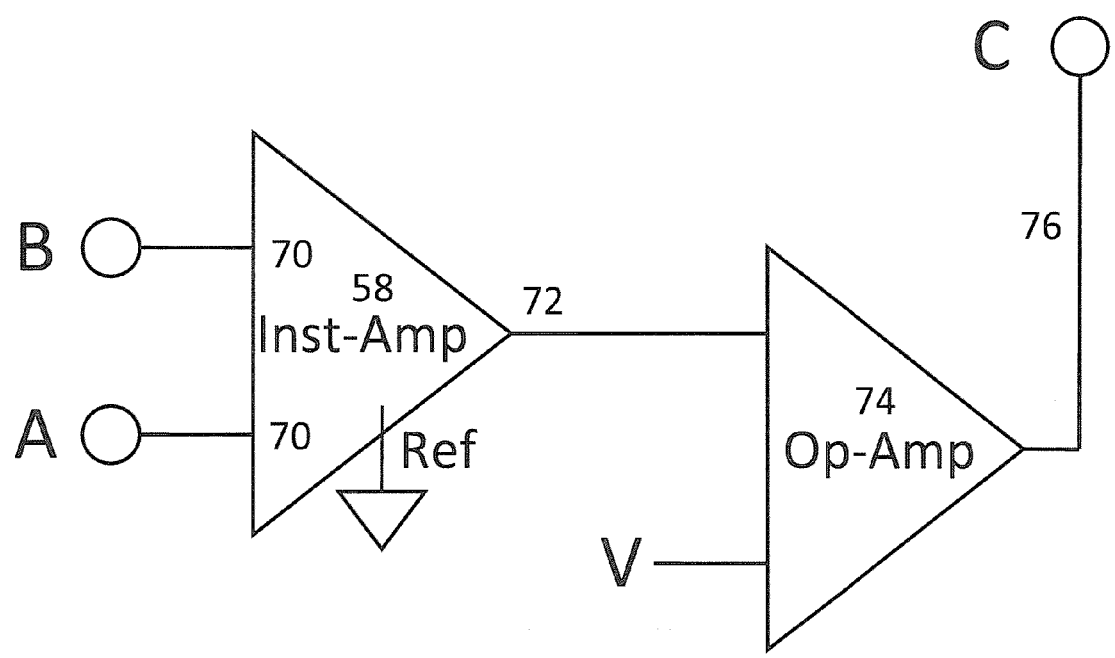
FIG. 12 is an electrical schematic of an alternative voltage clamp circuit.

An alternative scheme that can be implemented on chip 100 contains an instrumentation amplifier 58 and an operational amplifier 62, as shown in FIG. 12. In this scheme, the instrumentation amp 58 acts as an op-amp and voltage source. The Instrumentation amp 58 senses the voltage at its inputs 70 (which have effectively infinite input impedance). This voltage difference is multiplied by a modest gain factor (typically less than 1000) on an output line 72 referenced to ground. This signal is then compared to an applied on-chip voltage referenced to ground through an operational amplifier 74 (effectively infinite gain and infinite input impedance). The output of the op-amp 74 is negatively fed back into the circuit through the current leads 76.

Scaling Up to Many Memristor Elements with Feedback

Figure 13:
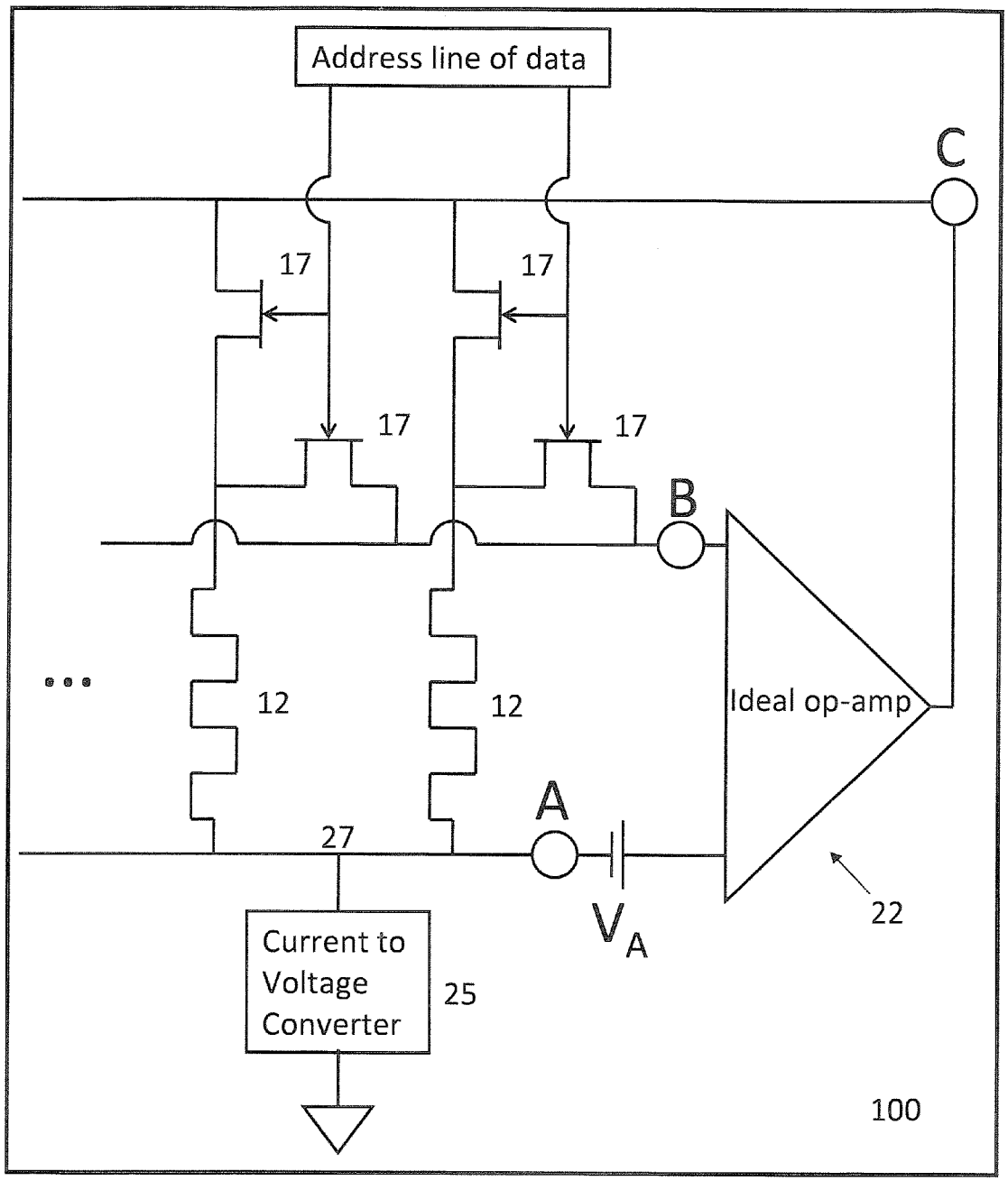
FIG. 13 is an electrical schematic of a scaled up integrated electronic device.

Scaling the feedback memristive scheme up to many elements can be achieved using the method shown in FIG. 13. Here, the voltage clamp source and op-amp 22 are schematically represented as in FIG. 10, yet they can be constructed by standard on-chip micro-fabrication. In this scheme, only one voltage clamp controller 22 is required to both control and sense a plurality of memristive elements 10. An externally applied address signal will determine which of a series of memristors 12 is activated for either writing or sensing its state. Setting the address line high for any and only one of the memristor elements 12 causes one pair of transistor 17 associated with their corresponding memristor 12 to be switched ON. This now allows for the application of a current from the op-amp output and for voltage lead connection at point A in FIG. 13. A single current to voltage circuit 25 connected at the output 27 can also be utilized to sense the state of any of the memory elements 12.

The following experimental example is presented to further illustrate the invention.

EXAMPLE 1

Methods

All samples were fabricated using a Raith e_Line electron-beam lithography (EBL) system. A bi-layer resist consisting of 300 nm of methyl-methacrylate/methacrylic-acid (MMA/MAA) copolymer and 50 nm of poly(methyl-methacrylate) (PMMA) were spun onto oxidized silicon substrates (300 nm thermal oxide). Following EBL exposure (30 kV, 220 µA/cm$^2$), samples were developed in a mixture of 3:1 isopropanol:methyl-isobutyl-keytone (IPA:MIBK) for 60 seconds and then immediately placed in an electron-beam evaporation chamber for metal deposition. 20 nm of Au was evaporated at normal incidence (no additional adhesion layer was used). Metal lift-off was performed in a bath of N-Methyl-2-Pyrrolidinone (NMP) held at 70° C. for approximately 1 hour.

Electrical measurements were carried out at room temperature using a custom-built micro-probe station and voltage-clamp circuit. Current was measured using a Keithley 6517A electrometer and all data were acquired using LabVIEW.

Memristors can be used as nanoscale logic and memory devices. Using electromigration, we repeatedly switch the resistance of single-component metallic nanowires between low and high states over many cycles.

Since the first developments of integrated circuits (ICs), electromigration has been known to degrade the structures and interconnects of their components, thereby limiting their useful lifetime. In recent years electromigration, which was once the bane of the microelectronics community, has become a topic of intense interest due to its potential in fabricating nanoscale structures at size scales much smaller than is possible with other nanolithography techniques. Recent advances utilizing feedback controlled electromigration (FCE) have yielded reproducible methods for forming ~1 nm scale features. Most of this work has investigated electromigration on the nanoscale with the objective of utilizing it as a fabrication technique for developing electrical devices at ever-smaller sizes. Here, we utilize electromigration itself as the nanoscale electrical switch by demonstrating a significant memristive effect in single-component metallic nanowires.

The devices consist of 20 nm thick gold nanowires with an initial width of ~100 nm and length of ~300 nm. FIG. 14a shows a scanning-electron microscope (SEM) image of a typical nanowire structure. Each nanowire is connected to two large leads that allow the current to flow. Two additional smaller leads stem off of the current leads and allow for the application of an applied bias voltage to the nanowire. The entire nanowire and leads structure is fabricated using electron-beam lithography on $SiO_2$/Si substrates having a 300 nm thick thermal oxide ($SiO_2$) layer. All metallic nanowires were constructed without Ti or Cr adhesion layers, as is commonly employed in electromigration nanogap work, thus making the nanowires truly single component.

Figure 14B:
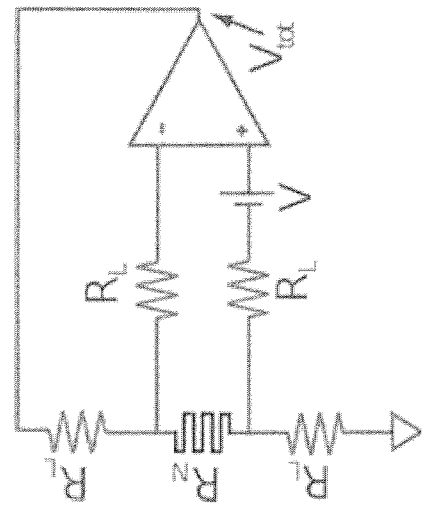
FIG. 14b is a schematic diagram of the voltage clamp circuit used to apply voltage to the nanowire in Example 1.
Figure 14A:
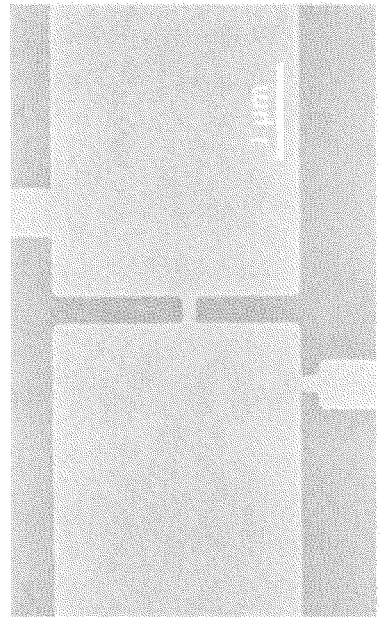
FIG. 14a is an SEM image of an electronic device, showing placement of voltage leads close to the nanowire region.

Due to the relatively high electrical conductance of the nanowire compared to the leads, electrical measurements were carried out using a voltage-clamp circuit (similar to a four-terminal circuit utilized recently for FCE) illustrated schematically in FIG. 14b. The operational amplifier (op-amp) maintains the applied voltage (V) across the nanowire, which has a variable resistance ($R_N$), by sourcing current from its output with a variable voltage ($V_{tot}$). Since negligible voltage is dropped across the lead resistances tied into the op-amp inputs, V appears across the metallic nanowire regardless of its resistance, $R_N$. When the nanowire resistance changes due to electromigration, the op-amp swings its total current and voltage output ($V_{tot}$) so that the voltage drop across the metallic nanowire is clamped at V. This voltage-clamp circuit prevents thermal runaway that can take place if, instead, the applied voltage is controlled away from the metallic nanowire at the point of $V_{tot}$ in the circuit in FIG. 14b. Essentially, the voltage clamp circuit takes the place of slower feedback algorithms used in the past to control electromigration.

Figure 14F:
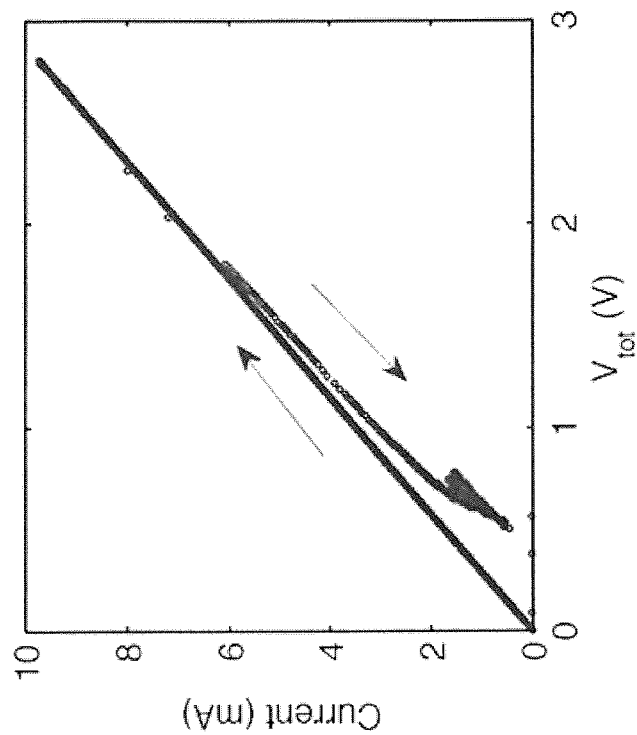
FIGS. 14e and 14f are respective graphical representations of total current and conductance of the nanowire circuit as a function of total voltage applied to the circuit, including the lead resistances $R_L$.
Figure 14E:
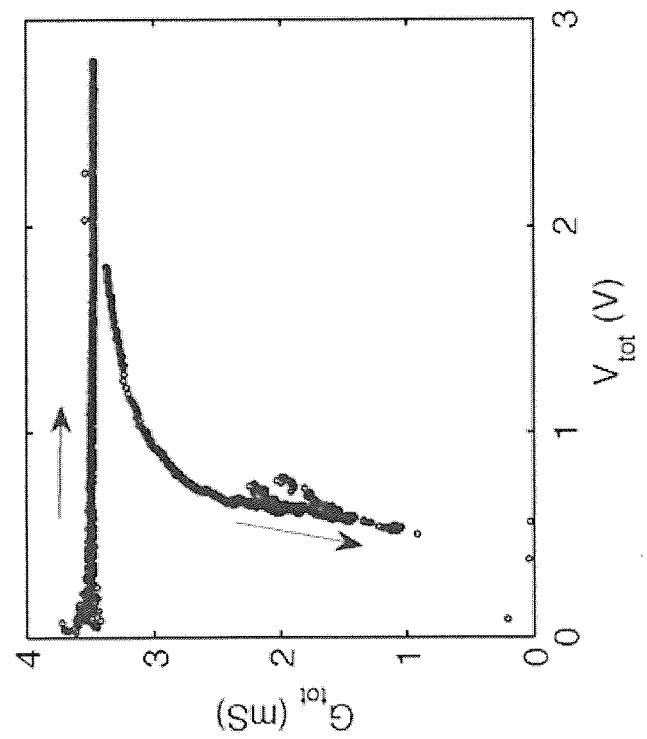
Figures 15A, 15B:
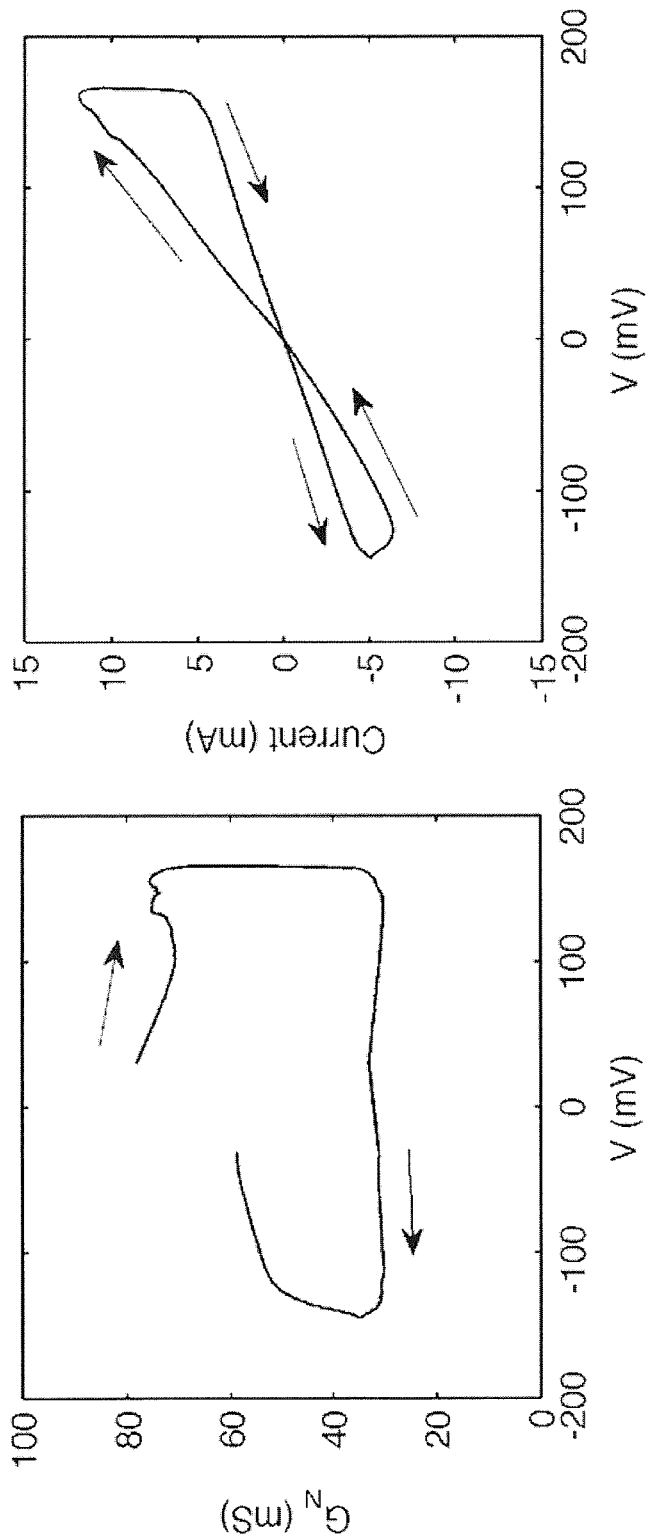
FIG. 15a is a graphical representation of conductance of the nanowire over one voltage ramp cycle showing significant hysteresis or memristance.
FIG. 15b illustrates the same memristance effect as FIG. 15a but shown as an I-V curve.

In FIG. 14c we show the current through the nanowire as a function of time as the applied voltage is ramped with a single linear sweep over a period of 600 seconds. When the applied voltage is ~150 mV, the nanowire conductance drops significantly due to electromigration. The inset of FIG. 14c shows the resulting electromigrated break and the corresponding conductance is shown in FIG. 14d. FIGS. 14e and 14f show the total current and conductance of the complete nanowire circuit as a function of total voltage ($V_{tot}$) applied to the circuit, including the lead resistances $R_L$. The data exhibit the typical "C"-shaped curves commonly observed when taken using software algorithms of FCE, illustrating that the voltage-clamp circuit works in the same manner. In order to observe memristance in our nanowire devices, we exploit the anti-symmetric nature of the electromigration process. During an initial voltage ramp (FIG. 15a), a critical power dissipation is reached in the wire and electromigration begins which causes the conductance to decrease. The voltage is then reduced and ramped in the opposite direction. At roughly the same critical power dissipation corresponding to a negative applied voltage, electromigration begins again but now acts to increase the wire conductance as voids created during the initial voltage ramp are refilled. FIG. 15b shows the current-voltage (I-V) curve of this device as a function of the applied V for one complete cycle in which a void is formed and then refilled.

Figure 4:
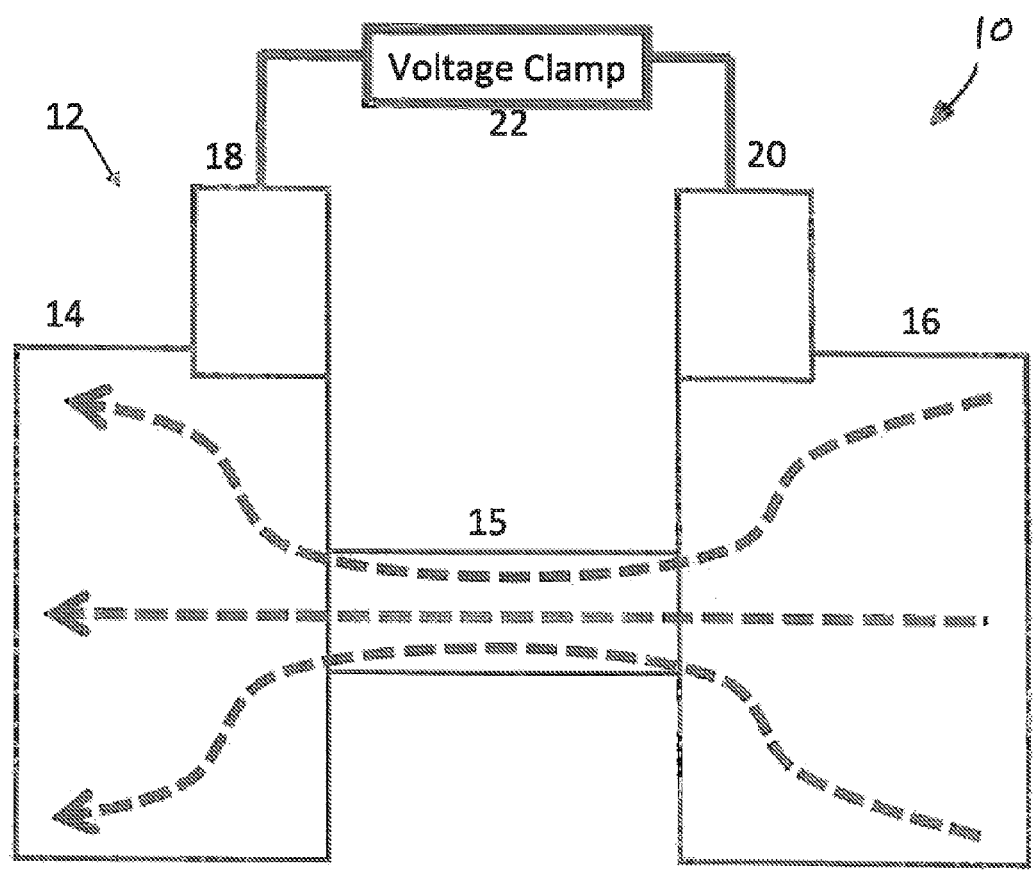
FIG. 4 is a schematical block diagram similar to FIGS. 1-3 showing how reverse current flow fills the void previously created by electromigration thereby restoring the electronic device to its original state.

FIGS. 1, 2 and 4 illustrate schematically the mechanism of memristance in our nanowire devices. The initial voltage ramp in the positive direction imparts momentum onto the metallic atoms so that they move downstream with the flow of electrons. The voids that open in the nanowire can significantly decrease its conductivity. Upon reversal of the electrical current, the electrons impart momentum to the metallic atoms in the opposite direction and the void is refilled, thus returning the nanowire conductance close to its original value. The resulting I-V behavior of the wire (FIG. 15b) models that of a memristor, where voids are created and refilled by changing the direction and magnitude of the applied voltage.

Figure 15C:
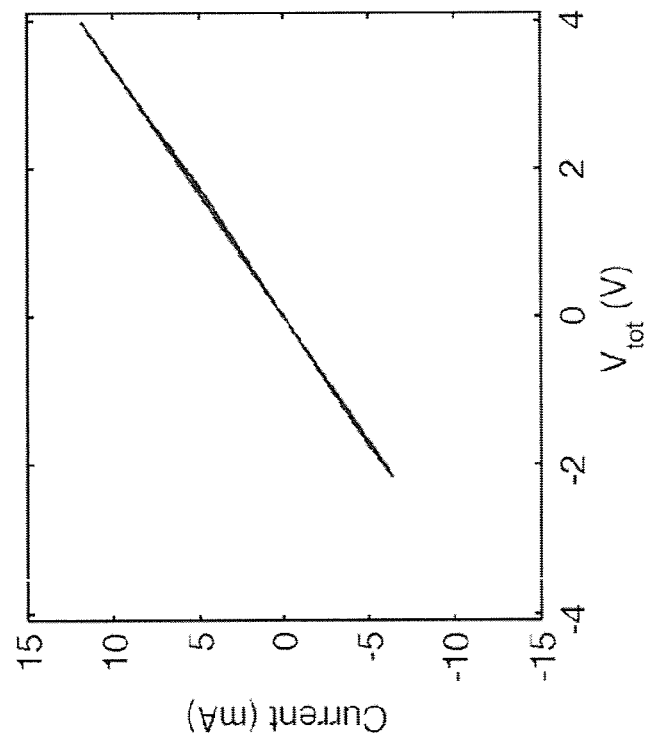
FIG. 15c graphically illustrates current plotted against $V_{tot}$, the voltage applied across the entire circuit.
Figure 14F:
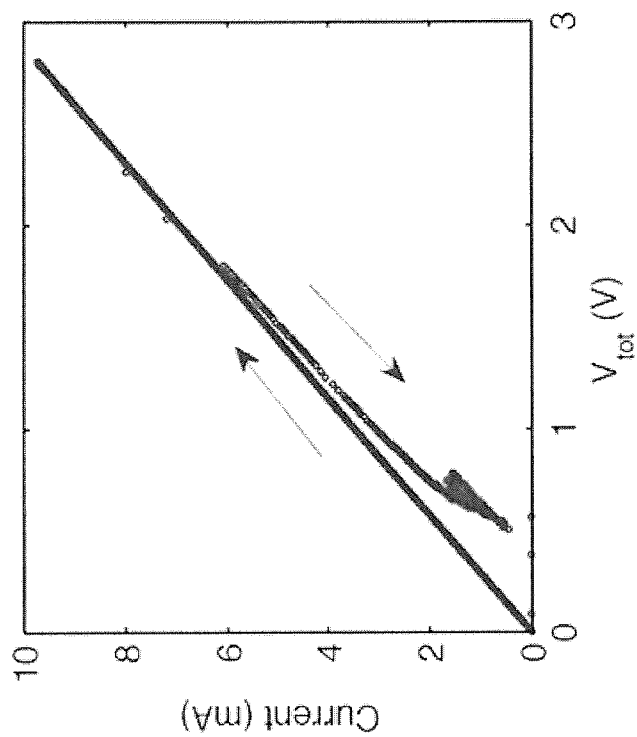
Figure 14E:
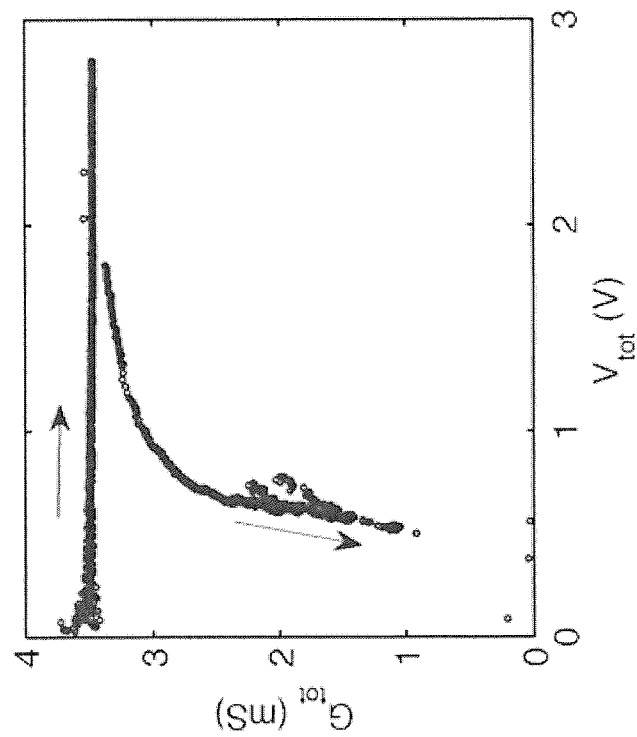

We observe and control the memristance of our electromigration-based device by implementation of the voltage-clamp circuit (FIG. 14b). The voltage clamp allows for the monitoring and control of the memristance of the nanowire without the effect being obscured by the typical lead resistances (~200Ω) in the system. In FIG. 15c we show data corresponding to the same memristance cycle in FIGS. 15a and 15b, but instead plot the current as a function of $V_{tot}$, the voltage that would need to be applied to the entire circuit if the voltage clamp were not used. Clearly, the memristance effect is strongly obscured by the lead resistance.

Figure 16A:
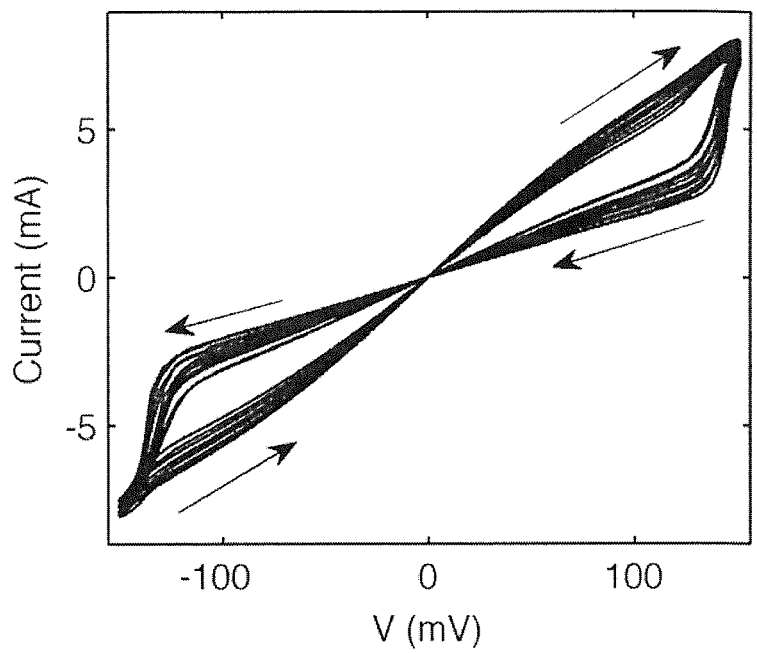
FIG. 16a shows I-V curves demonstrating the repeatability of switching over 14 cycles.
Figure 16B:
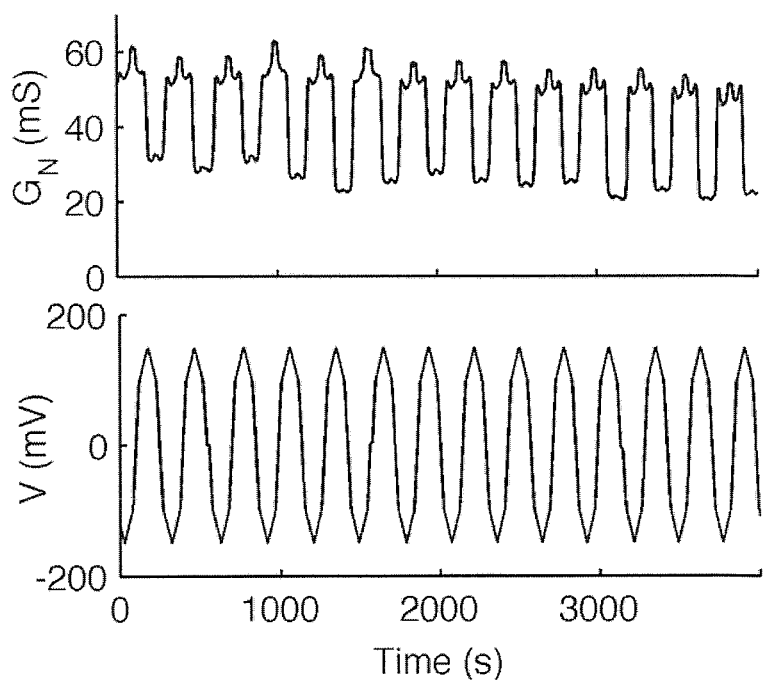

This memristive effect in metallic nanowires can be reproduced over many cycles. FIG. 16a shows the I-V curves of 14 consecutive cycles of a nanowire having an applied sawtooth voltage as a function of time, with the corresponding conductance and applied voltage shown in FIG. 16b. The I-V curves show a clear reproducible memristance effect with an on/off ratio of ~2, as shown in FIG. 16b. We find that such repeatability is typical in our devices, and that devices may be disconnected and reconnected without altering the devices' memristive properties. We also generally find that the reproducibility of this memristive effect improves after the first few cycles of the electromigration of a nanowire. This improvement in reproducibility is likely due to the completion of restructuring of grain boundaries within the nanowire region that occurs during current-induced Joule heating in the early stages of resistive switching.

The minimum nanowire width during a memristive cycle can be estimated from the conductance value at its low state. Assuming a quantum of conductance ($G_0 = 7.75 \times 10^{-5}$ S) for each atomic channel and a diameter for gold atoms of ~0.3 nm yields a cross sectional area of approximately 35 nm$^2$ for the wire at its narrowest point. If the thickness of the wire is approximately 3 nm, as suggested by recent electromigration work, then this would correspond to a wire width of about 12 nm. To achieve the on/off conductance values in FIG. 16b would require the movement of at least about 40,000 Au atoms, assuming that the length of the electromigrated region of the wire is approximately 20 nm long. Considerably lower conductance values, and as a result greater on/off ratios, could be achieved if this minimum wire dimension is decreased further. Moreover, a narrower wire would require the movement of much less material and could thus increase response times.

In summary, we have developed a new type of memristor—one whose resistance changes with geometry through electromigration. Due to the prevalence of electromigration in conducting materials and the fact that the memristance depends on its geometrical form, we expect that this effect could be useful in a wide assortment of nanoscale conductors.

The foregoing description has been presented for purposes of illustration and description. It is not intended to be exhaustive or to limit the invention to the precise form disclosed. Obvious modifications or variations are possible in light of the above teachings. The embodiments were chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled. The drawings and preferred embodiments do not and are not intended to limit the ordinary meaning of the claims in their fair and broad interpretation in any way.

What is claimed:

1. An electronic device, comprising:
a first electrode;
a second electrode;
a nanowire connected between said first electrode and said second electrode to allow electric current flow, said nanowire being made from a conductive material exhibiting variable resistance $R_N$ due to electromigration and said nanowire being repeatably switchable between a first state having a first physical geometry producing a first resistance $R_1$ and a second state having a second physical geometry producing a second resistance $R_2$ where $R_1 > R_2$;
a third electrode;
a fourth electrode; and
a voltage clamp connected between said third and fourth electrodes and operating through feedback control connected to said nanowire, said voltage clamp producing a bias voltage $V_{tot}$ that maintains the applied voltage V across said nanowire regardless of resistance $R_N$ and prevents thermal runaway and nonreversible device failure.

2. The electronic device of claim 1, wherein said voltage clamp comprises a circuit including a combination of an operational amplifier, an instrumentation amplifier, a follower, and transistors connected to said first electrode by a first lead and to said second electrode by a second lead.

3. The electronic device of claim 1, wherein said voltage clamp comprises an integrated voltage control device.

4. The electronic device of claim 3, wherein said integrated voltage control device includes at least one transistor.

5. The electronic device of claim 1, further including at least one sense electrode for sensing electric resistance of said nanowire.

6. The electronic device of claim 1, further including a first sense electrode connected to said first electrode and a second sense electrode connected to said second electrode.

7. The electronic device of claim 1, wherein said nanowire, said first electrode and said second electrode are made from a single component material.

8. The electronic device of claim 1, wherein said nanowire, said first electrode, said second electrode and said voltage clamp are all provided on a single substrate.

9. An integrated electronic device, comprising:
(a) a plurality of nanowire memristor structures arranged on a single substrate, each of said plurality of memristor structures including;
a first electrode;
a second electrode;
a nanowire connected between said first electrode and said second electrode to allow electric current flow, said nanowire being made from a conductive material exhibiting variable resistance $R_N$ due to electromigration and said nanowire being repeatably switchable between a first state having a first physical geometry producing a first resistance $R_1$ and a second state having a second physical geometry producing a second resistance $R_2$ where $R_1 > R_2$;
a third electrode;
a fourth electrode;
(b) a voltage clamp connected between said third and fourth electrodes and arranged on said single substrate and connected to said nanowire of each memristor structure of said plurality of memristor structures, said voltage clamp operating through feedback control and producing a bias voltage $V_{tot}$ that maintains the applied voltage V across said nanowire regardless of resistance $R_N$ and prevents thermal runaway.

10. The integrated electronic device of claim 9, wherein said voltage clamp comprises an integrated voltage control device.

11. The integrated electronic device of claim 10, wherein said integrated voltage control device includes an operational amplifier connected to said plurality of memristor structures.

12. The integrated electronic device of claim 11, wherein said integrated voltage control device further includes at least one selectively addressable transistor associated with each memristor structure of said plurality of memristor structures.

13. The integrated electronic device of claim 9, further including a sense electrode for sensing electric resistance of said nanowire.

14. The integrated electronic device of claim 9, further including a first sense electrode connected to said first electrode and a second sense electrode connected to said second electrode.

15. The integrated electronic device of claim 9, wherein said nanowire, said first electrode and said second electrode are made from a single component material.

16. The integrated device of claim 9, wherein said nanowire, said first electrode and said second electrode are made from multi-component materials.

17. The integrated device of claim 16, wherein said multi-component materials contain nanomaterials selected from a group consisting of graphene, carbon nanotubes and mixtures thereof.

18. The integrated electronic device of claim 12, further including a sense electrode for sensing electric resistance of said nanowire.

19. The integrated electronic device of claim 12, further including a first sense electrode connected to said first electrode and a second sense electrode connected to said second electrode.

20. The integrated electronic device of claim 12, wherein said nanowire, said first electrode and said second electrode are made from a single component material.

* * * * *